United States Patent
Bidard et al.

(10) Patent No.: US 6,852,561 B2
(45) Date of Patent: Feb. 8, 2005

(54) ENCAPSULATED SURFACE ACOUSTIC WAVE COMPONENT AND METHOD OF COLLECTIVE FABRICATION

(75) Inventors: Agnés Bidard, L'Hay les Roses (FR); Jean-Marc Bureau, Valbonne (FR)

(73) Assignee: Thomson-CSF, Paris (FR)

(*) Notice: Subject to any disclaimer, the term of this patent is extended or adjusted under 35 U.S.C. 154(b) by 0 days.

(21) Appl. No.: 10/682,907

(22) Filed: Oct. 14, 2003

(65) Prior Publication Data

US 2004/0103509 A1 Jun. 3, 2004

Related U.S. Application Data

(62) Division of application No. 09/601,327, filed on Aug. 8, 2000, now abandoned, which is a continuation of application No. PCT/FR99/03036, filed on Dec. 7, 1999.

(30) Foreign Application Priority Data

Dec. 8, 1998 (FR) .............................................. 98 15478

(51) Int. Cl.[7] .............................................. H01L 21/00
(52) U.S. Cl. .......................... 438/50; 438/48; 438/458
(58) Field of Search ............................ 438/50, 48, 51, 438/52, 113, 455, 458

(56) References Cited

U.S. PATENT DOCUMENTS

| | | | |
|---|---|---|---|
| 4,734,608 A | 3/1988 | Takoshima | |
| 5,359,494 A | * 10/1994 | Morimoto | .................... 361/760 |
| 5,459,368 A | 10/1995 | Onishi et al. | |
| 5,699,027 A | 12/1997 | Tsuji | |
| 5,821,665 A | 10/1998 | Onishi et al. | |
| 5,920,142 A | 7/1999 | Onishi et al. | |
| 5,969,461 A | * 10/1999 | Anderson et al. | ........ 310/313 R |
| 6,078,123 A | 6/2000 | Tanaka et al. | |
| 6,078,229 A | * 6/2000 | Funada et al. | ............... 333/193 |
| 6,150,748 A | 11/2000 | Fukiharu | |
| 6,181,015 B1 | * 1/2001 | Gotoh et al. | ................. 257/778 |
| 6,514,789 B2 | * 2/2003 | Denton et al. | .............. 438/106 |

FOREIGN PATENT DOCUMENTS

| | | |
|---|---|---|
| DE | 39 37 870 A | 5/1991 |
| GB | 2 171 850 A | 9/1986 |

* cited by examiner

*Primary Examiner*—Michael Trinh
(74) *Attorney, Agent, or Firm*—Oblon, Spivak, McClelland, Maier & Neustadt, P.C.

(57) ABSTRACT

The invention relates to a new type of encapsulated surface acoustic wave component and to a method for the batch production of such components.

The component comprises a surface acoustic wave device on the surface of a substrate. The encapsulation package furthermore comprises the substrate, a first layer located on the substrate and hollowed out locally at least at the level of the active surface of the surface acoustic wave device, a printed circuit covering entire first layer and conductive via holes going through the unit formed by the first layer and the printed circuit so as to provide for the electrical connection of the surface acoustic wave device from the exterior.

8 Claims, 3 Drawing Sheets

ENCAPSULATED SURFACE ACOUSTIC WAVE COMPONENT AND METHOD OF COLLECTIVE FABRICATION

CROSS-REFERENCE TO RELATED APPLICATIONS

This application is a Divisional of U.S. patent application Ser. No. 09/601,327, filed Aug. 8, 2000, now abandoned which is a Continuation of International patent application No. PCT/FR99/03036, filed Dec. 7, 1999, and claims priority to France patent application No. 98/15478, filed Dec. 8, 1998. The contents of these applications are incorporated herein by reference in their entirety.

BACKGROUND OF THE INVENTION

FIELD OF THE INVENTION

The field of the invention is that of surface acoustic wave devices especially that of the filters known as SAW (surface acoustic wave) filters that are used for the highly selective filtering of frequency bands. These components are designed for portable equipment such as radiotelephones, and it is essential to miniaturize them and their protective packaging.

Furthermore, since acoustic waves propagate in the vicinity of the surface of the piezoelectric substrate, this surface must be left vacant so as not to disturb the propagation of the waves. This is an additional constraint with regard to encapsulation packages.

DISCUSSION OF THE BACKGROUND

The present encapsulation technologies for surface acoustic wave filters are based on a package formed by two parts as shown in FIG. 1: a ceramic or organic base 01 and a ceramic, metallic or organic lid 02 whose closure by soldering or bonding provides for the hermetic sealing of the component while making the necessary cavity. In this type of package, the surface acoustic wave devices (or SAW devices) 03 can be assembled by being bonded to the base. The electrical connections between the internal contacts 011, 012 of the SAW device and the external contacts 071 and 072 are provided by metallized via holes through the base 01.

FIG. 1 illustrates an example of the prior art in which the electrical connections of the SAW device with the exterior are wire-type connections. For greater compactness, the technology used at present is the flip-chip technology (in which the component is flipped over). FIG. 2 shows an example of a prior art encapsulated SAW device which is a variant of FIG. 1.

In order to meet the requirements of large-scale consumer markets (in radiotelephony, automobiles, etc.), the new encapsulation technologies must make the filters increasingly small while at the same time reducing their manufacturing costs. As in the case of other components, the trend is towards the ever greater compactness of the packages in order to obtain a component/package assembly whose surface area is equal to that of the chip by itself.

SUMMARY OF THE INVENTION

The present invention meets these requirements by proposing a surface acoustic wave device in a tightly sealed cavity that has a micro-lid on the piezoelectric substrate alone, without increasing its surface area.

More specifically, an object of the invention is a surface acoustic wave component comprising at least one surface acoustic wave device encapsulated in a package, said device being made on the surface of a piezoelectric substrate by means of interdigitated electrodes powered by first conductive contacts internal to the surface of the substrate, characterized in that the package comprises, in addition to the substrate:
- a first layer located on the substrate and hollowed out locally at least at the level of the active surface of the surface acoustic wave device;
- a printed circuit covering the entire first layer, said printed circuit comprising second external conductive contacts;
- conductive via holes going through the unit formed by the first layer/printed circuit and connecting the first internal conductive contacts to the second external conductive contacts.

Advantageously, the first layer is made of resin and the via holes made in the first layer are used to make electrical connections between the surface acoustic wave devices and the micro-lid constituted by the printed circuit so as to provide for component transfer zones.

Furthermore, advantageously, the constituent resin of the first layer may locally replace the sound absorbent deposit.

The height of the module is reduced to the thickness of the printed circuit which typically may be in the range of 25 to 100 microns, the thickness of the first layer which is typically in the range of some tens of microns and the thickness of the piezoelectric substrate (some hundreds of microns).

An object of the invention is also a method for the collective fabrication of components comprising the making of surface acoustic wave devices on a piezoelectric substrate and comprising the following steps:
- the making of a first hollowed layer on all the surface acoustic wave devices;
- the bonding of a printed circuit to said first layer;
- the making of via holes in the printed circuit and the first layer at the level of the first internal conductive contacts of the surface acoustic wave devices;
- the metallizing of the via holes and the defining of second external conductive contacts, said second contacts being connected to said first contacts by the metallized via holes;
- the cutting out of the unit formed by the substrate, the first layer and the printed circuit so as to separate the surface acoustic wave components.

The hollowed layer can be obtained by the preliminary deposition of a uniform layer followed by etching, or else by the lamination of a previously hollowed layer or else again by silk-screen printing.

Advantageously, the first layer may have acoustic absorbent properties.

In the manufacture of surface acoustic wave devices, the method of the invention has the advantage of being a method of collective fabrication on a piezoelectric substrate. This leads to a major reduction in cost. Furthermore, a batch production method of this kind is compatible with the technologies commonly used for semiconductors (the use of masking resin, and the photolitography method).

BRIEF DESCRIPTION OF THE DRAWINGS

The invention will understood more clearly and other advantages will appear from the following description, given as a non-restrictive example, and from the appended drawings, of which.

DESCRIPTION OF THE PREFERRED EMBODIMENTS

Figure 1:
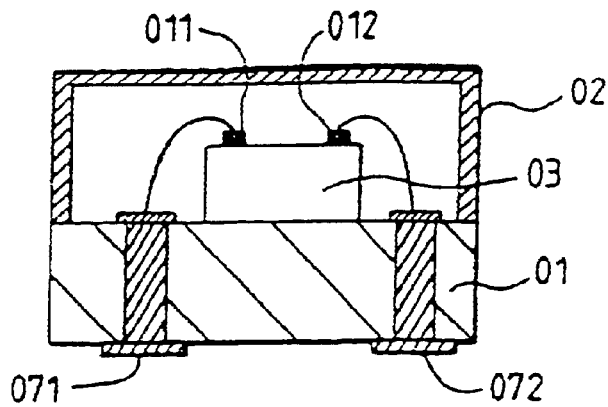
FIGS. 1 and 2 illustrate surface acoustic wave devices encapsulated according to prior art techniques.
Figure 2:
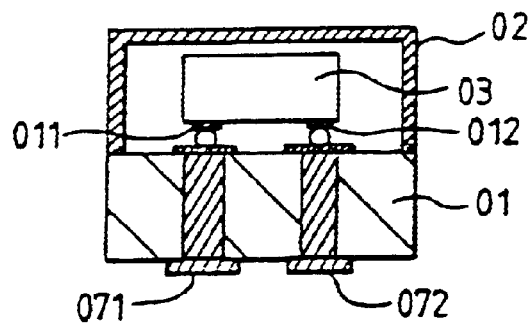
Figure 3:
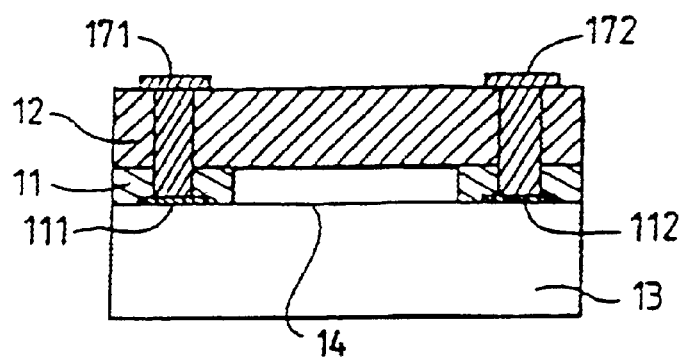
FIG. 3 illustrates an encapsulated SAW device module.

In general, the surface acoustic wave device may be a transducer, a resonator comprising at least one array and a transducer. In any case, it is obtained by the deposition of electrodes on the surface of a piezoelectric substrate. To enable the propagation of surface acoustic waves, it is then sought to create an unoccupied cavity above the electrodes corresponding to the active surface of the component. While it is highly compact, the component of the invention is used to preserve the cavity in an unoccupied state as can be seen in FIG. 3. The piezoelectric substrate 13 has electrodes on the surface which are not shown. These electrodes are at the level of the surface known as the active surface 14. The active surface is insulated from the exterior by the first layer 11 which lies on the piezoelectric substrate. A printed circuit 12 provides for tight sealing on the upper face. In the drawing shown herein, a transducer with two internal electrical power supply contacts 111 and 112 may be connected from the exterior by means of external upper contacts 171 and 172 and conductive via holes going through the printed circuit as well as the first layer. In the case of a more complex component that has to be powered by more than two sources, the number of via holes and contacts may be adjusted appropriately. The active surface acoustic wave component 14 may be considered to be encapsulated in a package defined by all the following elements: the piezoelectric substrate, the first layer 11 and the printed circuit 12.

A more detailed description is given here below of the steps of an exemplary method of collective fabrication used to obtain the components of the invention.

The Printed Circuit

A copper-coated laminated type of printed circuit, impregnated with polyimide resin or with epoxy based on unwoven alamode fibers may be used. The metallized face is used for the subsequent definition of the via holes. The nature of the printed circuit, namely the organic fibers, enables the material thus reinforced to combine high dimensional stability and a low coefficient of thermal expansion in the plane with low permittivity and low surface roughness. Finally, the aramide fibers are compatible with the drilling and metallizing of small-sized holes.

Figure 4A:
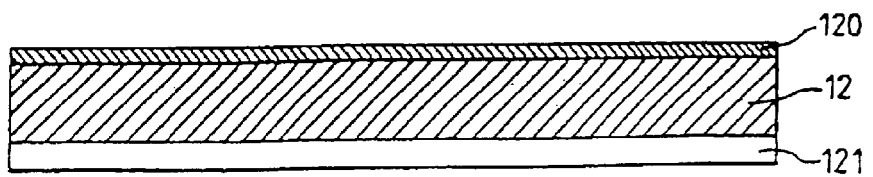
FIGS. 4a–4g illustrate the main steps of the method of collective fabrication of encapsulated SAW devices according to the invention.

Preferably, the printed circuit, on the face opposite to the metallized surface, has a second layer of insulating adhesive material that may be pre-bonded. FIG. 4a illustrates the three constituent layers of the printed circuit used in the invention, the metal layer 120, the printed circuit 12 and the adhesive layer 121.

Making of the Cavities Above the Active Surfaces of the SAW Devices

Figure 4B:
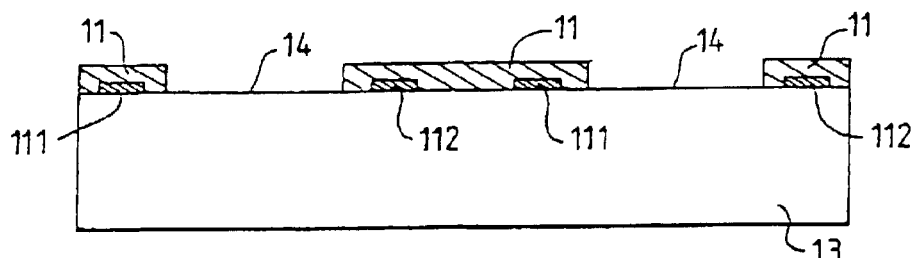

A photosensitive epoxy resin type of constituent resin of the first layer 11 is deposited by spin coating on the piezoelectric substrate. After an annealing operation, the resin is photoimaged and then undergoes a second annealing operation. After development, the substrate and then the resin are put into a stove. FIG. 4b illustrates the piezoelectric substrate 13 comprising SAW devices whose active surfaces 14 are cleared of resin 11. The resin remains, especially on the internal conductive contacts of the SAW devices 111 and 112. For easy representation, only two SAW devices are shown but the piezoelectric substrate has an entire set of them.

Bonding of the Printed Circuit to the Layer 11

More specifically, this is a step for pressing the circuit shown schematically in FIG. 4a to the substrate which locally comprises the resin and is shown schematically in FIG. 4b. The two elements are pressed under heat for example in an autoclave. Typically, the heat cycle is adapted so as to relieve the stresses of the materials that are present and prevent heat shocks.

Making the Connection System

Etching of the Conductive Layer 120 to Make the via Holes

Figure 4C:
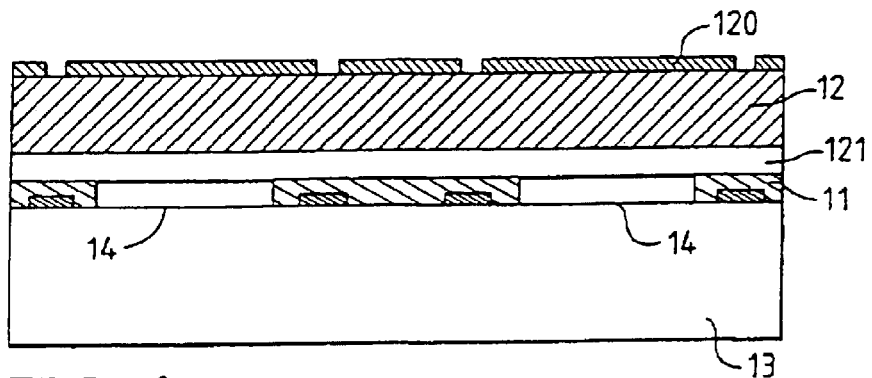

After a surface preparation (namely the degreasing and micro-etching) of the layer, which is typically made of copper, to increase the surface roughness of the copper and hence its adhesion, a photosensitive resin is deposited by spin coating on the copper-coated layer 120. The resin is insolated vertically with respect to the via holes with a photo-insolator. The insolation time is a function of the resin thickness. The copper that is not protected by the resin is dissolved for example in an ammonia solution. The resin is then removed for example with acetone and alcohol. A mask is thus defined in the layer 120 (FIG. 4c).

Figure 4D:
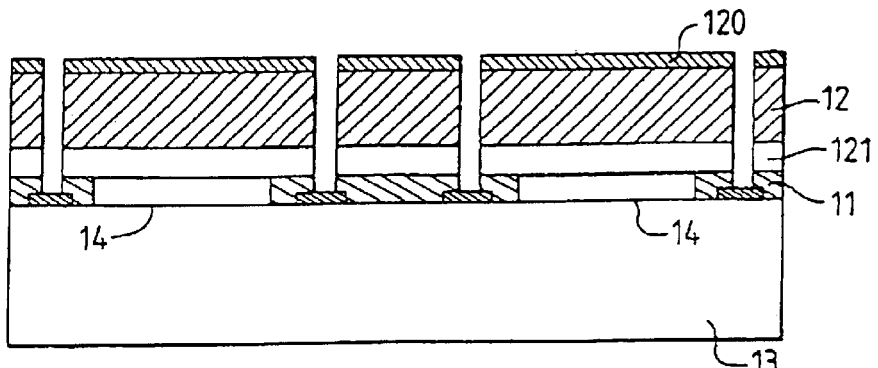

Ablation of the Assembly Formed by the Printed Circuit, Adhesive Layer and Resin Through the Copper Mask The making of via holes through the assembly can be done for example by excimer or $CO_2$ laser and then terminated for example by RIE (reactive ionic etching) with oxygen plasma. The via holes are shown in FIG. 4d.

Metallization of the Surface of the Substrate and the Vias

After the ablation of the vias, the copper mask may be etched if necessary. Then the circuit is then metallized by sputtering for example. A layer of chromium and then copper 122 for example, with a thickness of some microns, is deposited uniformly throughout the surface of the printed circuit and inside the holes. The cycle performed in the stand uses sputtering and may typically be as follows:

- an argon plasma operation to mechanically etch the fine layer of native aluminum oxide if need be;
- a sputtering of chromium: the chromium layer plays the role of a barrier layer;
- a sputtering of copper.

Figure 4E:
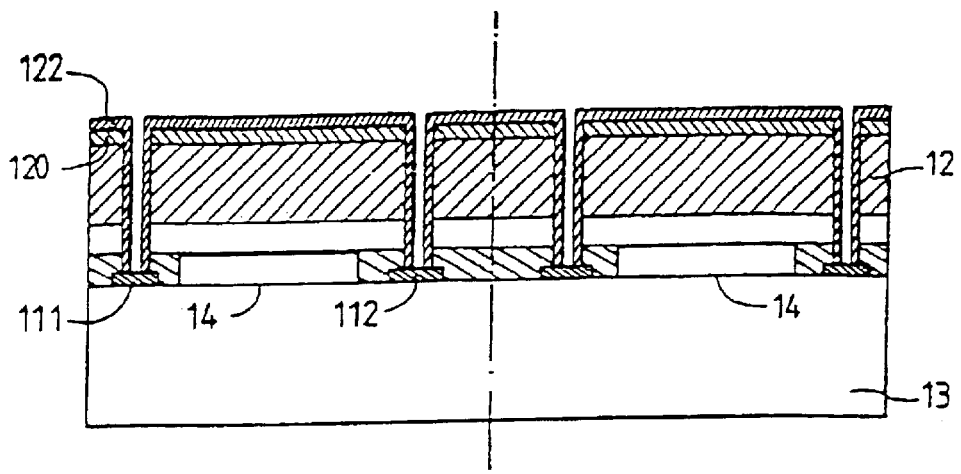

It is then possible to carry out an electrolytic copper recharging to increase the thickness of the metallization to a few tens of microns and thus increase the thermomechanical stability of the via holes (FIG. 4e).

The Making of the External Conductive Contacts

A photosensitive resin is deposited on the entire conductive surface (substrate+via holes). The resin is insolated vertically with respect to the external contacts with a photoinsolator so as to leave resin on the external conductive contacts, also known as "pads", around the via holes and resin fitting itself to the shape of the walls of the via holes (in the case of a positive resin).

The copper not protected by resin is chemically etched. The resin is then removed for example with acetone and alcohol.

Figure 4G:
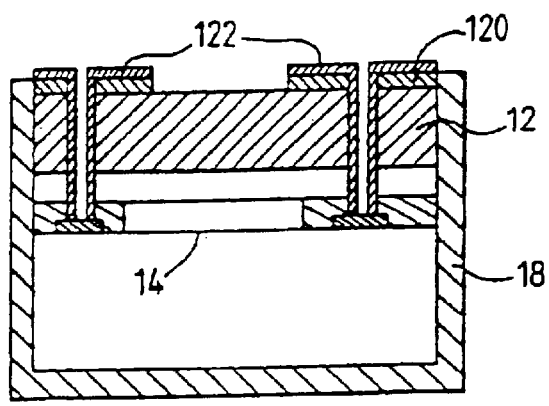
Figure 4F:
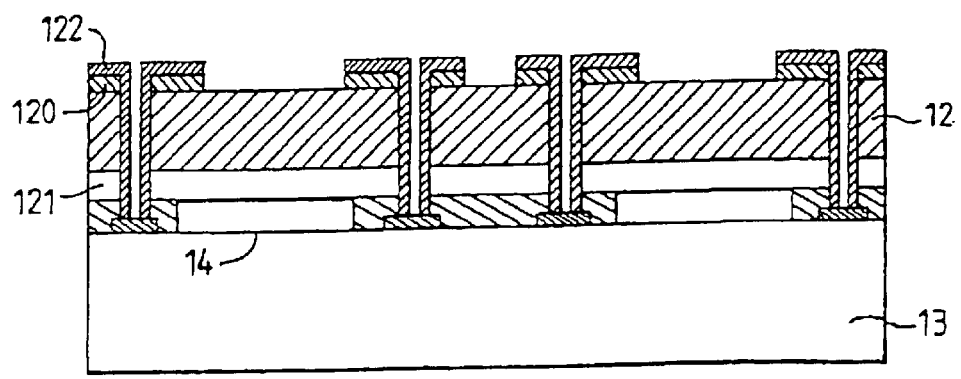

Thus, all the encapsulated components are obtained as a batch with external connection contacts as shown in FIG. 4f.

Cutting Out of Individual Components

Then, the components are cut out mechanically. It is possible to deposit a third layer 18 providing hermetic sealing of the assembly with the appropriate dielectric properties as illustrated in FIG. 4g. This layer may be obtained by metal sputtering, a deposition of a thin layer of conductive or dielectric material, the deposition of a varnish or by resin casting or again by vapor phase deposition of a parylene type polymer. The value of these methods lies in the fact that both the lower face of the substrate and the flanks of the previously made component may thus be covered.

This protection may serve as a mechanical protection, a base for markings, an electromagnetic shielding and/or a hermetically sealed type of protection against the environment.

What is claimed is:

1. A method for collective fabrication of surface acoustic wave components, comprising:

making surface acoustic wave devices on a piezoelectric substrate;

making first internal conductive contacts on a surface of said surface acoustic wave devices;

making a first hollowed layer on all of the surface acoustic wave devices such that said first internal conductive contacts are completely covered by said first hollowed layer;

bonding a printed circuit to said first hollowed layer to form cavities between said printed circuit and said substrate in hollows of said first hollowed layer;

making via holes in the printed circuit and the first hollowed layer up to the first internal conductive contacts of the surface acoustic wave devices;

metallizing the via holes and defining second external conductive contacts such that said second external conductive contacts are connected to said first internal conductive contacts by the metallized via holes; and cutting out an assembly formed by the substrate, at least a pair of said first internal conductive contacts, the first hollowed layer, at least a pair of said second external conductive contacts, and the printed circuit so as to separate the surface acoustic wave components.

2. The method according to claim 1, wherein the making of the first hollowed layer is obtained by a preliminary deposition of a uniform layer, followed by the etching of said uniform layer.

3. The method according to claim 1, wherein the making of the first hollowed layer is obtained by the lamination of a previously hollowed out layer.

4. The method according to claim 1, wherein the bonding of the printed circuit to the first hollowed layer comprises:

depositing a second layer, known as an adhesive layer, on the printed circuit; and hot pressing the printed circuit/second layer on the entire unit formed by the first hollowed layer and the piezoelectric substrate.

5. The method according to claim 1, further comprising:

making a third layer, called a coating layer, on a lower face of the substrate and on side faces of the component.

6. The method according to claim 5, further comprising:

forming the third layer by sputtering.

7. The method according to claim 5, further comprising:

forming the third layer by the vapor phase deposition of a parylene type polymer.

8. The method according to claim 5, further comprising:

forming the third layer by the deposition of a varnish.

* * * * *